United States Patent
Huang et al.

(10) Patent No.: US 9,437,699 B2
(45) Date of Patent: Sep. 6, 2016

(54) METHOD OF FORMING NANOWIRES

(71) Applicant: Taiwan Semiconductor Manufacturing Company Limited, Hsinchu (TW)

(72) Inventors: Yu-Lien Huang, Hsinchu County (TW); Yung-Ta Li, Kaohsiung (TW); Meng-Ku Chen, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/505,631

(22) Filed: Oct. 3, 2014

(65) Prior Publication Data
US 2016/0099328 A1    Apr. 7, 2016

(51) Int. Cl.
| H01L 21/335 | (2006.01) |
| H01L 29/423 | (2006.01) |
| H01L 29/78 | (2006.01) |
| H01L 29/06 | (2006.01) |
| H01L 21/3065 | (2006.01) |
| H01L 21/02 | (2006.01) |

(52) U.S. Cl.
CPC ... *H01L 29/42392* (2013.01); *H01L 21/02636* (2013.01); *H01L 21/3065* (2013.01); *H01L 29/0676* (2013.01); *H01L 29/785* (2013.01); *H01L 29/7827* (2013.01)

(58) Field of Classification Search
USPC .......................................................... 438/142
See application file for complete search history.

(56) References Cited

U.S. PATENT DOCUMENTS 7,772,048 B2 *   8/2010   Jones ................... H01L 21/84
                                                                257/E21.205
2008/0206934 A1   8/2008   Jones et al.

FOREIGN PATENT DOCUMENTS

| KR | 20070033794 | 3/2007 |
| KR | 20090093081 | 9/2009 |
| KR | 20130066724 | 6/2013 |
| TW | 201411846 | 3/2014 |
| WO | 2013103163 | 7/2013 |

OTHER PUBLICATIONS

Korean Office Action; Application No. 10-2014-0183000; dated Dec. 18, 2015.
Taiwanese Office Action; Application No. 104132458; dated Jun. 21, 2016.

\* cited by examiner

*Primary Examiner* — Timor Karimy
(74) *Attorney, Agent, or Firm* — Jones Day

(57) ABSTRACT

According to another embodiment, a semiconductor structure is provided. The structure includes: a substrate; a first nanowire over the substrate; and a second nanowire over the substrate and substantially symmetric with the first nanowire.

15 Claims, 28 Drawing Sheets

METHOD OF FORMING NANOWIRES

BACKGROUND

Semiconductor devices, such as gate-all-around (GAA) transistors, are an emerging research area in the semiconductor industry. However, size of the device is a challenge because of technology limitations. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
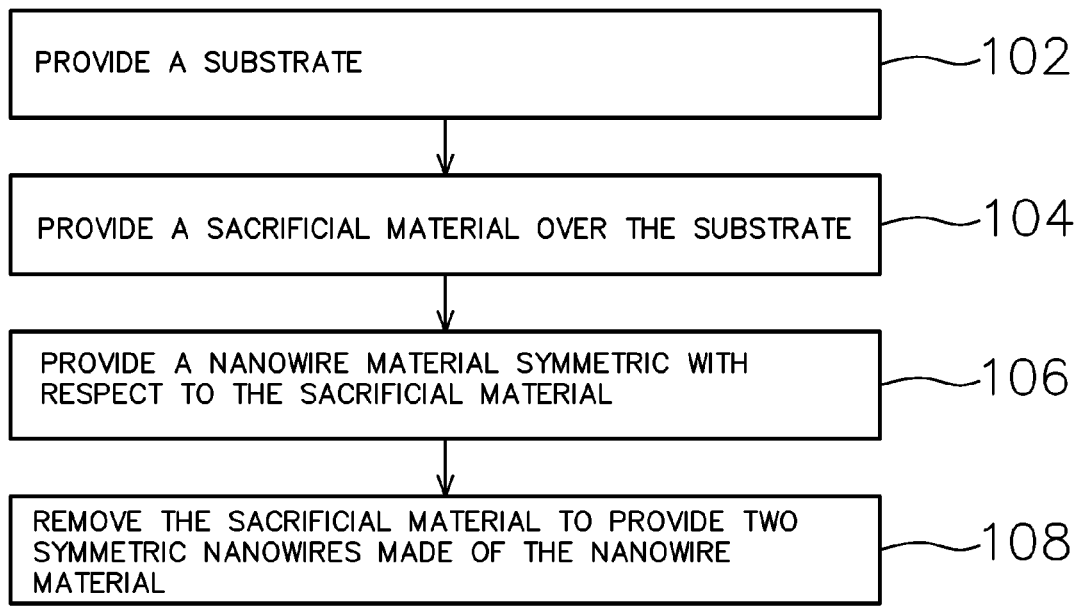
FIG. 1 is a flow chart of a method of forming nanowires in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart of a method of forming nanowires in accordance with some embodiments. As shown in FIG. 1, the method 100 begins with the provision of a substrate, for example, substrate 202 (operation 102). A sacrificial material, for example, sacrificial material 204, is then provided over the substrate (operation 104). A nanowire material, for example, material 302, is provided symmetric with respect to the sacrificial material (operation 106). The sacrificial material is removed to provide two symmetric nanowires made of the nanowire material (operation 108).

Figure 2A:
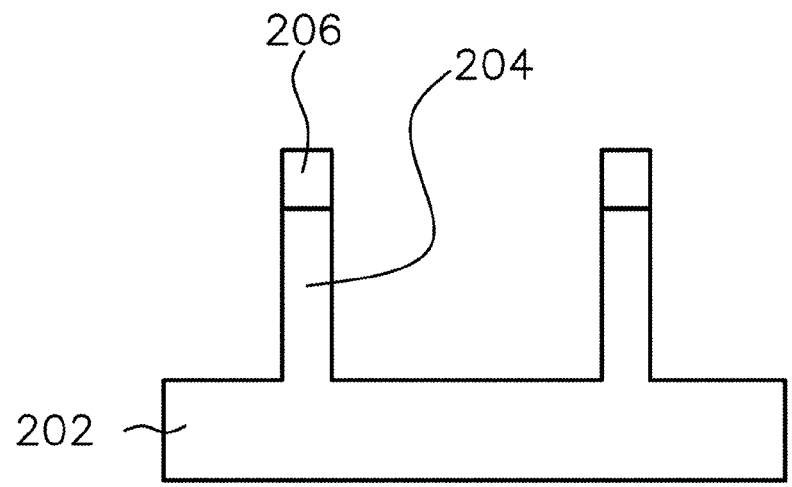
FIG. 2A is a sectional view of an exemplary semiconductor structure at one stage during fabrication of annular nanowires for vertical gate all around transistors in accordance with some embodiments.
Figure 2B:
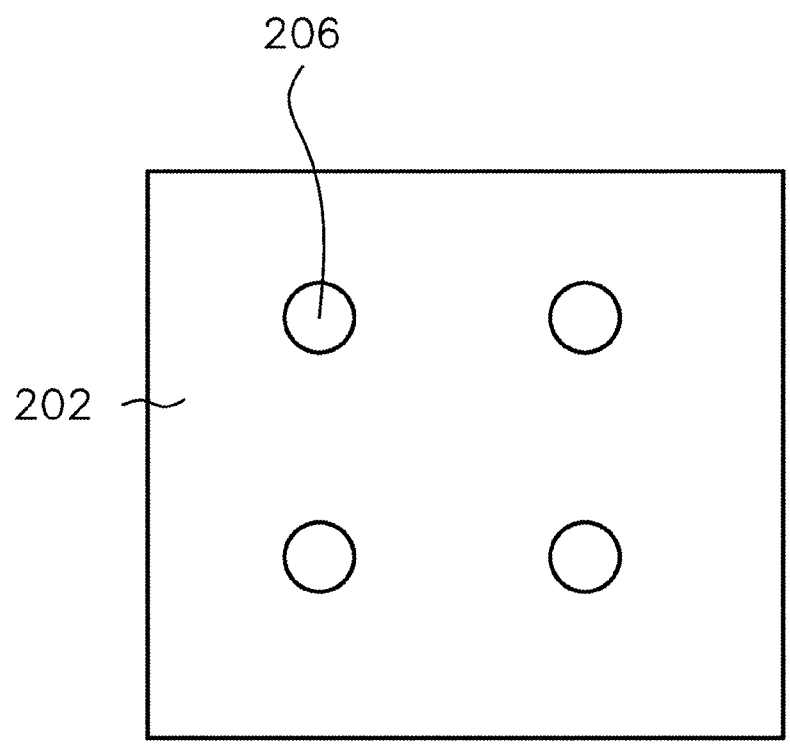
FIG. 2B is a top view of an exemplary semiconductor structure at one stage during fabrication of annular nanowires for vertical gate all around transistors in accordance with some embodiments.

FIG. 2A is a sectional view of an exemplary semiconductor structure at one stage during fabrication of annular nanowires for vertical gate all around transistors in accordance with some embodiments. FIG. 2B is a top view of an exemplary semiconductor structure at one stage during fabrication of annular nanowires for vertical gate all around transistors in accordance with some embodiments. As shown in FIGS. 2A and 2B, a substrate 202 is provided (e.g., operation 102 of FIG. 1). The material of the substrate 202 may include, for example, Si, SiGe, Ge, or III-V (InP, GaAs, AlAs, InAs, InAlAs, InGaAs, InSb, GaSb, InGaSb).

A sacrificial protrusion 204 is provided over the substrate 202 (e.g., operation 104 of FIG. 1). The material of the sacrificial protrusion 204 may include, for example, Si, SiGe, Ge, or III-V (InP, GaAs, AlAs, InAs, InAlAs, InGaAs, InSb, GaSb, InGaSb). In some embodiments, the sacrificial protrusion 204 is in a round shape, and has a height of about 30-70 nanometers and a diameter of about 17 nanometers. In some embodiments, a hard mask 206 made of SiCN is provided over the top of the sacrificial protrusion 204.

The formation of the substrate 202, the sacrificial protrusion 204, and the hard mask 206 may be realized by: (1) bottom-up formation of a multilayer structure having the substrate, an oxide layer, a SiOC layer, a silicon anti-reflection coating, and a photoresist; (2) patterning of the silicon anti-reflection coating and the SiOC layer with the photoresist; (3) patterning of the oxide layer, and removing of the SiOC layer and the silicon anti-reflection coating; (4) filling of SiCN portions in recesses produced by patterning of the oxide layer; (5) removing of the oxide layer to expose the substrate; and (6) trimming of the SiCN portions and etch-back of the substrate to form the sacrificial protrusion with the hard mask.

Figure 3A:
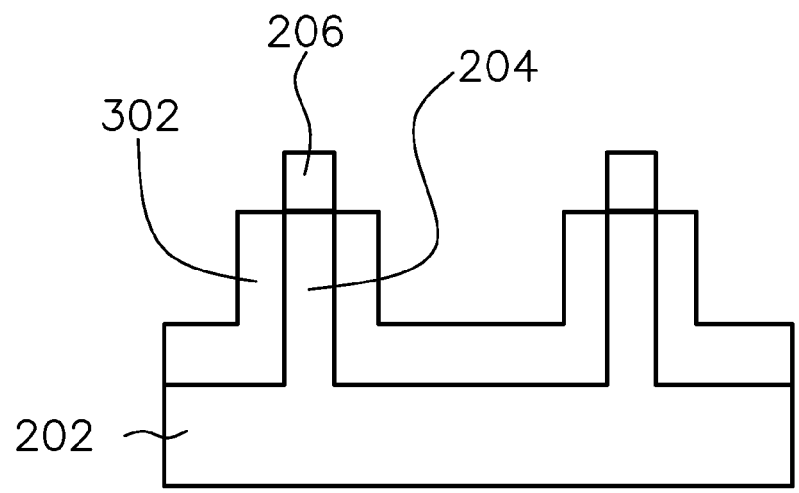
FIG. 3A is a sectional view of an exemplary semiconductor structure at one stage during fabrication of annular nanowires for vertical gate all around transistors in accordance with some embodiments.
Figure 3B:
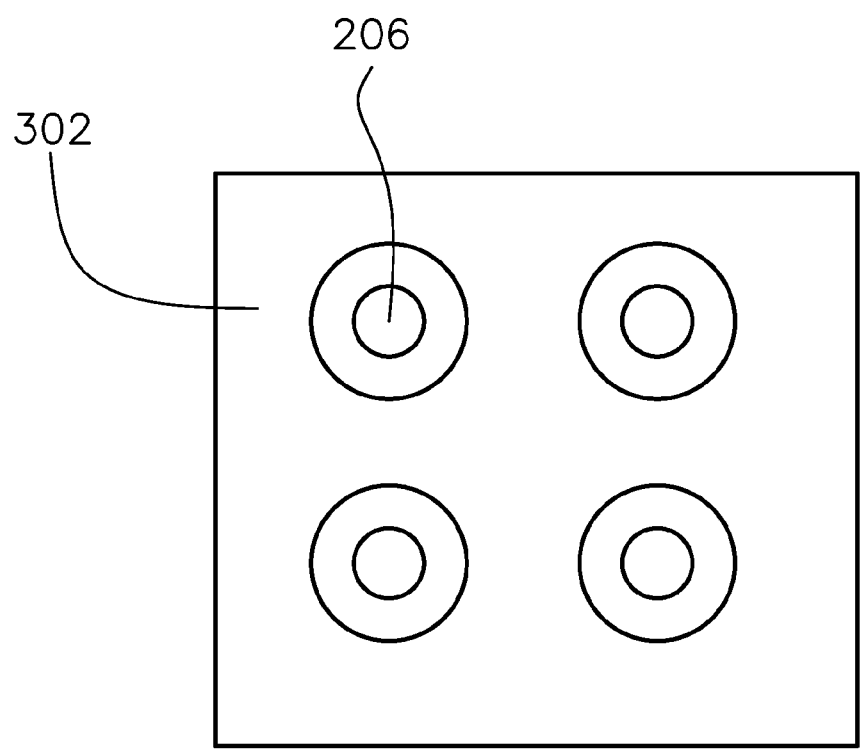
FIG. 3B is a top view of an exemplary semiconductor structure at one stage during fabrication of annular nanowires for vertical gate all around transistors in accordance with some embodiments.

FIG. 3A is a sectional view of an exemplary semiconductor structure at one stage during fabrication of annular nanowires for vertical gate all around transistors in accordance with some embodiments. FIG. 3B is a top view of an exemplary semiconductor structure at one stage during fabrication of annular nanowires for vertical gate all around transistors in accordance with some embodiments. As shown in FIGS. 3A and 3B, a nanowire material 302 is provided symmetric with respect to the sacrificial protrusion 204 (e.g., operation 106 of FIG. 1). In some embodiments, the nanowire material 302 having an annular shape surrounds the sacrificial protrusion 204. In some embodiments, the provision of nanowire material 302 for a thickness of 1-20 nanometers may be realized by conformal epitaxial growth on the sacrificial protrusion 204 and the substrate 202, except for the portion of the sacrificial protrusion 204 covered by the hard mask 206. An exemplary condition for the epitaxial growth includes: a pressure of 10-20 torr, a temperature of 570-600° C., and reactants of $GeH_4$ of 100-600 sccm, $SiCl_2H_2$ of 100-600 sccm, and HCl of 50-200 sccm. In some embodiments, the nanowire material 302 is SiGe, and the sacrificial protrusion 204 and the substrate 202 are made of silicon.

Figure 4A:
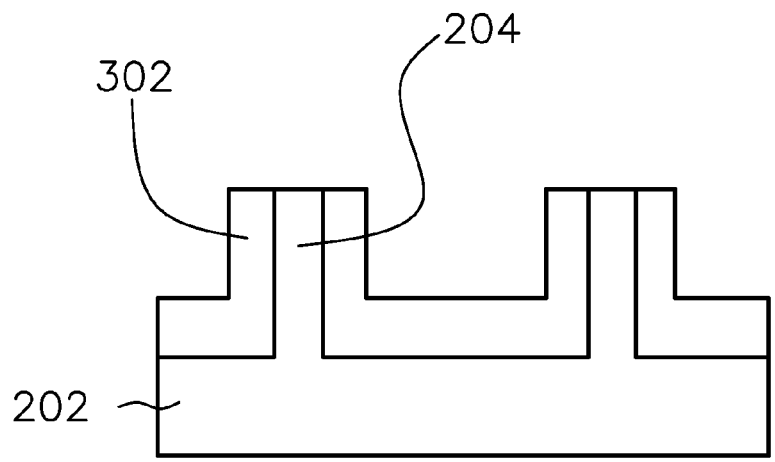
FIG. 4A is a sectional view of an exemplary semiconductor structure at one stage during fabrication of annular nanowires for vertical gate all around transistors in accordance with some embodiments.
Figure 4B:
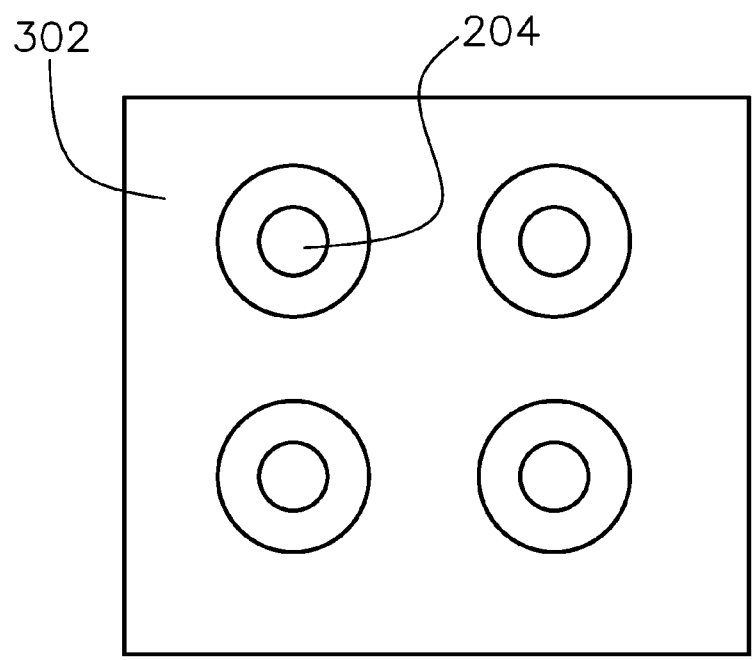
FIG. 4B is a top view of an exemplary semiconductor structure at one stage during fabrication of annular nanowires for vertical gate all around transistors in accordance with some embodiments.

FIG. 4A is a sectional view of an exemplary semiconductor structure at one stage during fabrication of annular nanowires for vertical gate all around transistors in accordance with some embodiments. FIG. 4B is a top view of an exemplary semiconductor structure at one stage during fabrication of annular nanowires for vertical gate all around transistors in accordance with some embodiments. As shown in FIGS. 4A and 4B, the hard mask 206 is removed to expose the sacrificial protrusion 204 as a mandrel by using dry etching, for example, ICP (inductively coupled plasma), TCP (transformer coupled plasma), ECR (electron cyclotron resonance), or RIE (reactive ion etch) with F-based or Cl-based gaseous reactants.

Figure 5A:
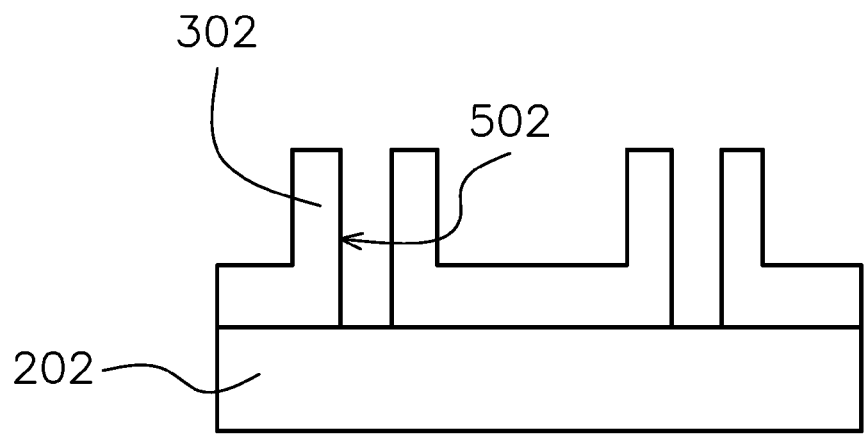
FIG. 5A is a sectional view of an exemplary semiconductor structure at one stage during fabrication of annular nanowires for vertical gate all around transistors in accordance with some embodiments.
Figure 5B:
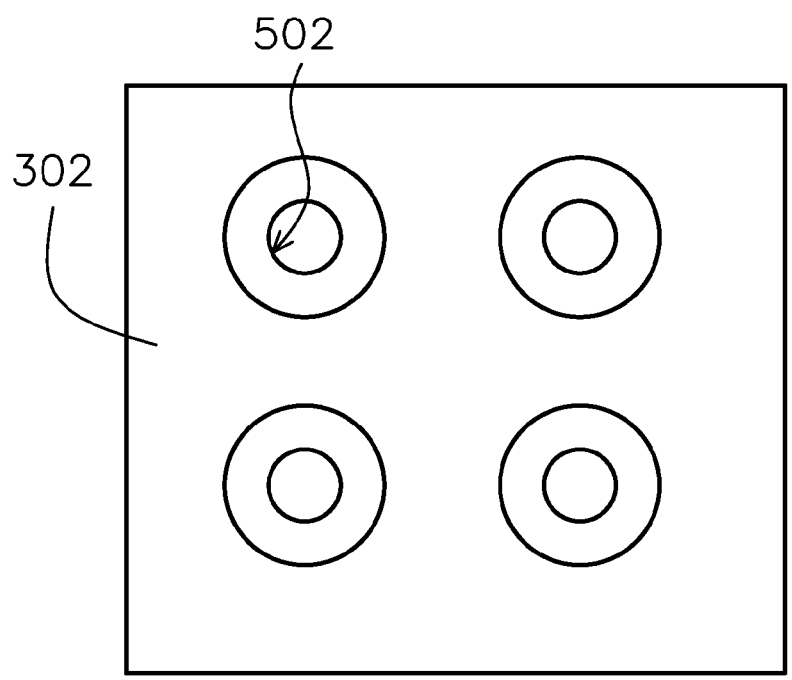
FIG. 5B is a top view of an exemplary semiconductor structure at one stage during fabrication of annular nanowires for vertical gate all around transistors in accordance with some embodiments.

FIG. 5A is a sectional view of an exemplary semiconductor structure at one stage during fabrication of annular nanowires for vertical gate all around transistors in accordance with some embodiments. FIG. 5B is a top view of an exemplary semiconductor structure at one stage during fabrication of annular nanowires for vertical gate all around transistors in accordance with some embodiments. As shown in FIGS. 5A and 5B, the sacrificial protrusion 204 is removed to expose an inner surface 502 of the nanowire material 302. In case that the nanowire material 302 is SiGe and the sacrificial protrusion 204 is made of silicon, the removal of the sacrificial protrusion 204 may be realized by using $NH_4OH$ so as to selectively remove the sacrificial protrusion 204 while keeping the nanowire material 302.

Figure 6A:
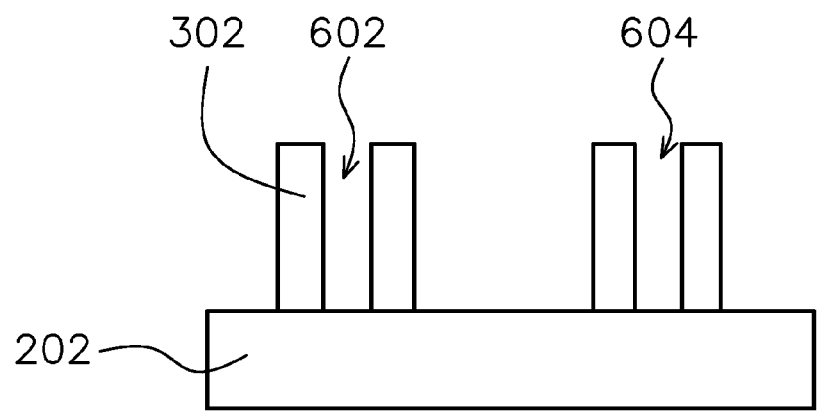
FIG. 6A is a sectional view of an exemplary semiconductor structure at one stage during fabrication of annular nanowires for vertical gate all around transistors in accordance with some embodiments.
Figure 6B:
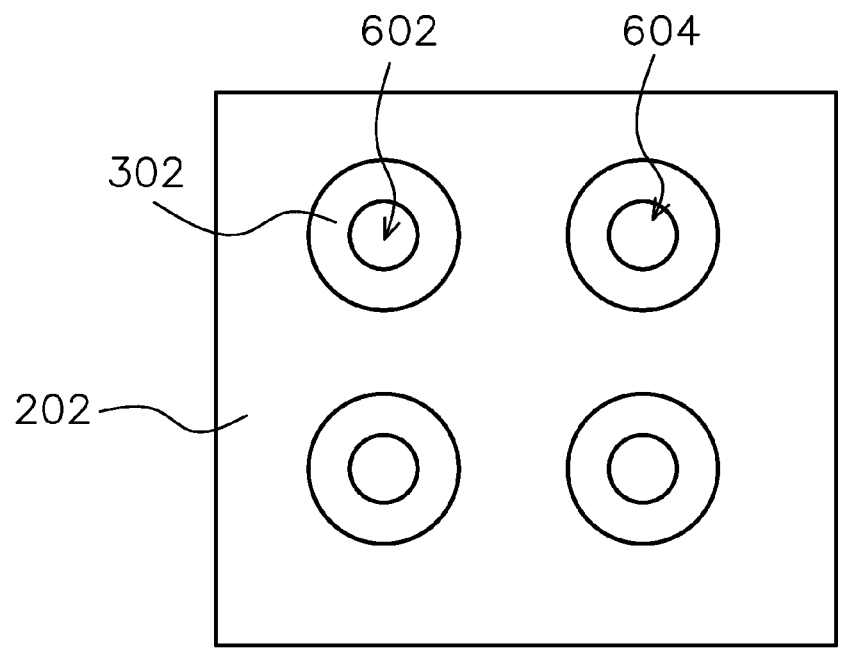
FIG. 6B is a top view of an exemplary semiconductor structure at one stage during fabrication of annular nanowires for vertical gate all around transistors in accordance with some embodiments.

FIG. 6A is a sectional view of an exemplary semiconductor structure at one stage during fabrication of annular nanowires for vertical gate all around transistors in accordance with some embodiments. FIG. 6B is a top view of an exemplary semiconductor structure at one stage during fabrication of annular nanowires for vertical gate all around transistors in accordance with some embodiments. As shown in FIGS. 6A and 6B, except for those to be formed as annular nanowires 602 and 604, the nanowire material 302 are removed, by using dry etching, for example, ICP (inductively coupled plasma), TCP (transformer coupled plasma), ECR (electron cyclotron resonance), or RIE (reactive ion etch) with F-based or Cl-based gaseous reactants. The annular nanowire 602 is substantially symmetric with respect to its center, and is used in a vertical gate all around transistor. The material of the annular nanowire 602 is different from that of the substrate 202. In some embodiments, shrinkage of the sacrificial protrusion 204 may be applied before the provision of the nanowire material 302 symmetric with respect to the sacrificial protrusion 204 (e.g., operation 106 of FIG. 1). In some embodiments, shrinkage of the annular nanowire 602 by using isotropic etching may be applied after the formation thereof.

In some embodiments, the hard mask 206 may not be provided. Instead, the nanowire material 302 may be provided by using epitaxial growth on the sacrificial protrusion 204 (including its top) and the substrate 202. Then, a portion of the nanowire material 302 over the top of the sacrificial protrusion 204 is removed to expose the sacrificial protrusion 204 by using CMP process or dry etching.

Furthermore, a plurality of processes may be performed on the semiconductor structure, such as, for example, providing a gate oxide adjacent to the annular nanowires 602 and 604; and providing a gate metal adjacent to the gate oxide.

Figure 7A:
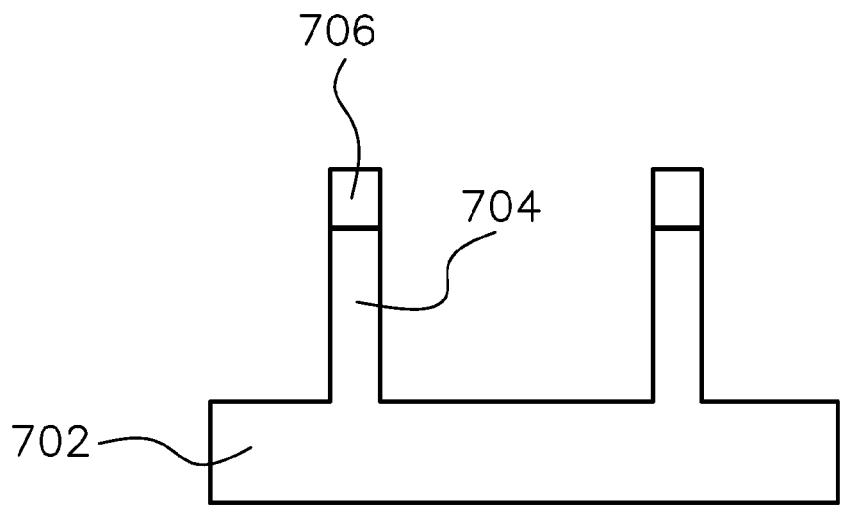
FIG. 7A is a sectional view of an exemplary semiconductor structure at one stage during fabrication of bare-shaped nanowires for vertical gate all around transistors in accordance with some embodiments.
Figure 7B:
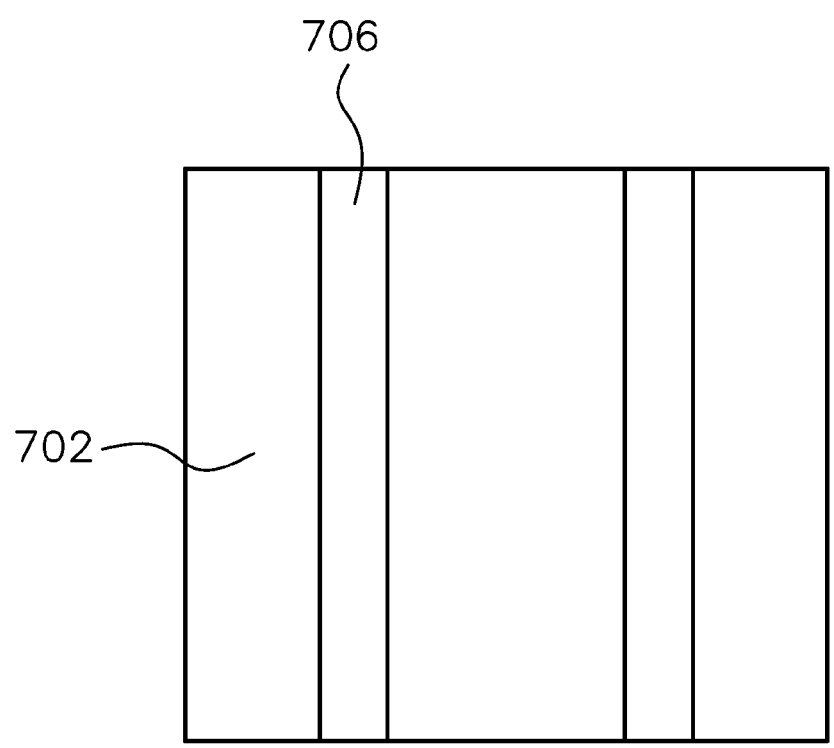
FIG. 7B is a top view of an exemplary semiconductor structure at one stage during fabrication of bare-shaped nanowires for vertical gate all around transistors in accordance with some embodiments.

FIG. 7A is a sectional view of an exemplary semiconductor structure at one stage during fabrication of bare-shaped nanowires for vertical gate all around transistors in accordance with some embodiments. FIG. 7B is a top view of an exemplary semiconductor structure at one stage during fabrication of bare-shaped nanowires for vertical gate all around transistors in accordance with some embodiments. As shown in FIGS. 7A and 7B, a substrate 702 is provided (e.g., operation 102 of FIG. 1). The material of the substrate 702 may include, for example, Si, SiGe, Ge, or III-V (InP, GaAs, AlAs, InAs, InAlAs, InGaAs, InSb, GaSb, InGaSb).

A sacrificial protrusion 704 is provided over the substrate 702 (e.g., operation 104 of FIG. 1). The material of the sacrificial protrusion 704 may include, for example, Si, SiGe, Ge, or III-V (InP, GaAs, AlAs, InAs, InAlAs, InGaAs, InSb, GaSb, InGaSb). In some embodiments, the sacrificial protrusion 704 is in a bare shape, and has a height of about 30-70 nanometers and a thickness of about 17 nanometers. In some embodiments, a hard mask 706 made of SiCN is provided over the top of the sacrificial protrusion 704.

The formation of the substrate 702, the sacrificial protrusion 704, and the hard mask 706 may be realized by: (1) bottom-up formation of a multilayer structure having the substrate, an oxide layer, a SiOC layer, a silicon anti-reflection coating, and a photoresist; (2) patterning of the silicon anti-reflection coating and the SiOC layer by using the photoresist; (3) patterning of the oxide layer and removing of the SiOC layer and the silicon anti-reflection coating; (4) filling of SiCN portions in recesses generated by patterning of the oxide layer; (5) removing of the oxide layer to expose the substrate; and (6) trimming of the SiCN portions and etch-back of the substrate to form the sacrificial protrusion with the hard mask.

Figure 8A:
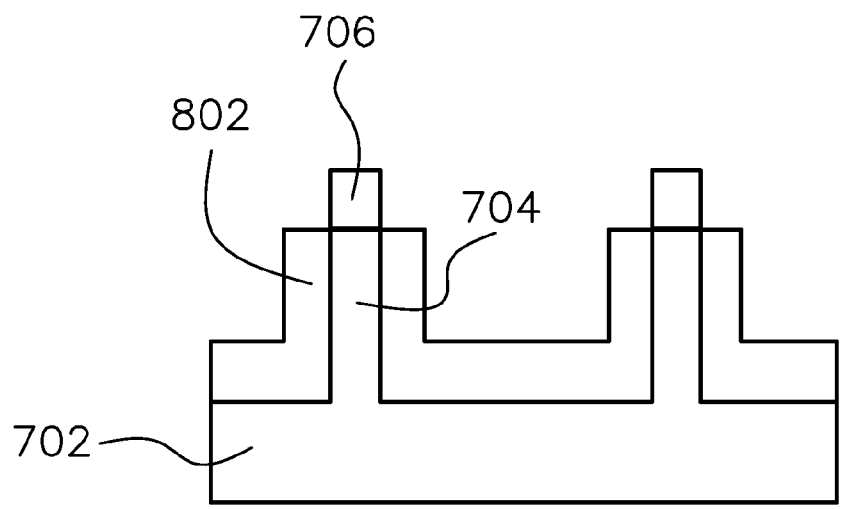
FIG. 8A is a sectional view of an exemplary semiconductor structure at one stage during fabrication of bare-shaped nanowires for vertical gate all around transistors in accordance with some embodiments.
Figure 8B:
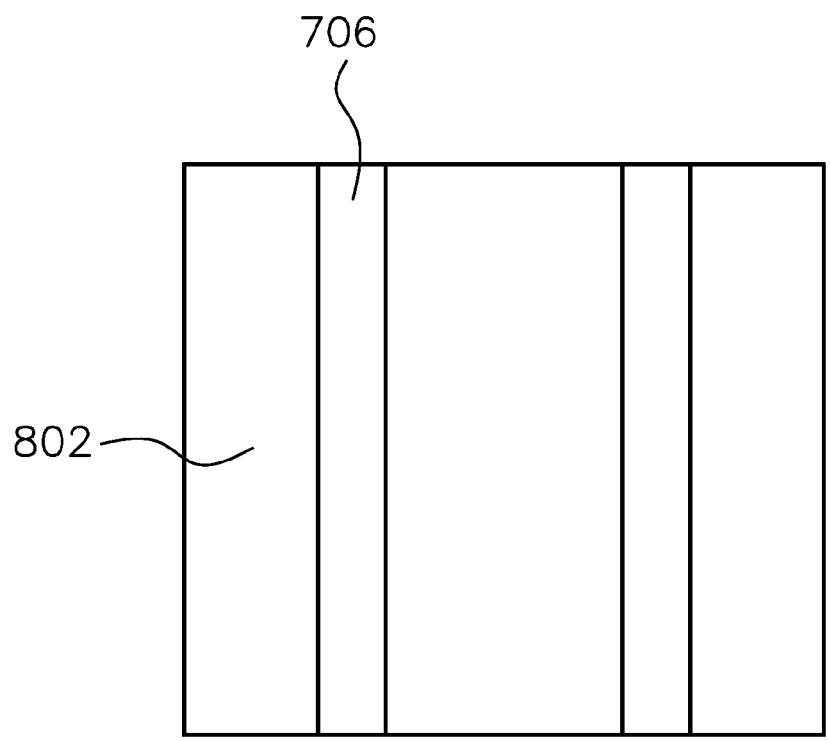
FIG. 8B is a top view of an exemplary semiconductor structure at one stage during fabrication of bare-shaped nanowires for vertical gate all around transistors in accordance with some embodiments.

FIG. 8A is a sectional view of an exemplary semiconductor structure at one stage during fabrication of bare-shaped nanowires for vertical gate all around transistors in accordance with some embodiments. FIG. 8B is a top view of an exemplary semiconductor structure at one stage during fabrication of bare-shaped nanowires for vertical gate all around transistors in accordance with some embodiments. As shown in FIGS. 8A and 8B, a nanowire material 802 is provided symmetric with respect to the sacrificial protrusion 704 (e.g., operation 106 of FIG. 1). In some embodiments, the nanowire material 802 having a bare shape covers sidewalls of the sacrificial protrusion 704. In some embodiments, the provision of nanowire material 802 for a thickness of about 1-20 nanometers may be realized by conformal epitaxial growth on the sacrificial protrusion 704 and the substrate 702. An exemplary condition for the epitaxial growth includes: a pressure of 10-20 torr, a temperature of 570-600° C., and reactants of $GeH_4$ of 100-600 sccm, $SiCl_2H_2$ of 100-600 sccm, and HCl of 50-200 sccm. In some embodiments, the nanowire material 802 is SiGe and the sacrificial protrusion 704 is made of silicon.

Figure 9A:
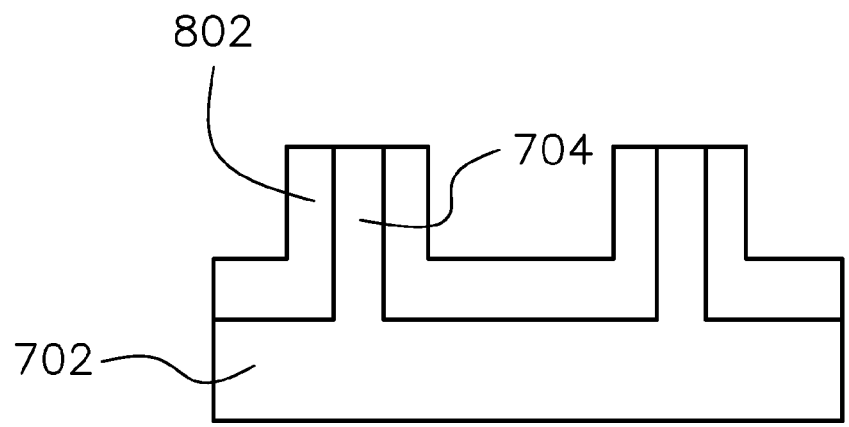
FIG. 9A is a sectional view of an exemplary semiconductor structure at one stage during fabrication of bare-shaped nanowires for vertical gate all around transistors in accordance with some embodiments.
Figure 9B:
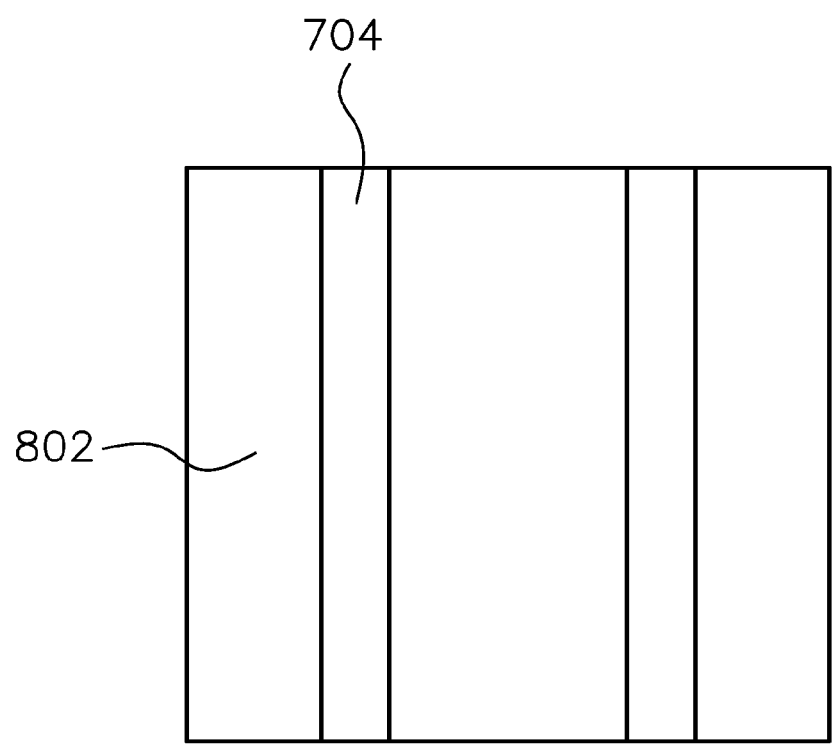
FIG. 9B is a top view of an exemplary semiconductor structure at one stage during fabrication of bare-shaped nanowires for vertical gate all around transistors in accordance with some embodiments.

FIG. 9A is a sectional view of an exemplary semiconductor structure at one stage during fabrication of bare-shaped nanowires for vertical gate all around transistors in accordance with some embodiments. FIG. 9B is a top view of an exemplary semiconductor structure at one stage during fabrication of bare-shaped nanowires for vertical gate all around transistors in accordance with some embodiments. As shown in FIGS. 9A and 9B, the hard mask 706 is removed to expose the sacrificial protrusion 704 as a mandrel by using dilute HF or by using dry etching, for example, ICP (inductively coupled plasma), TCP (transformer coupled plasma), ECR (electron cyclotron resonance), or RIE (reactive ion etch) with F-based or Cl-based gaseous reactants.

Figure 10A:
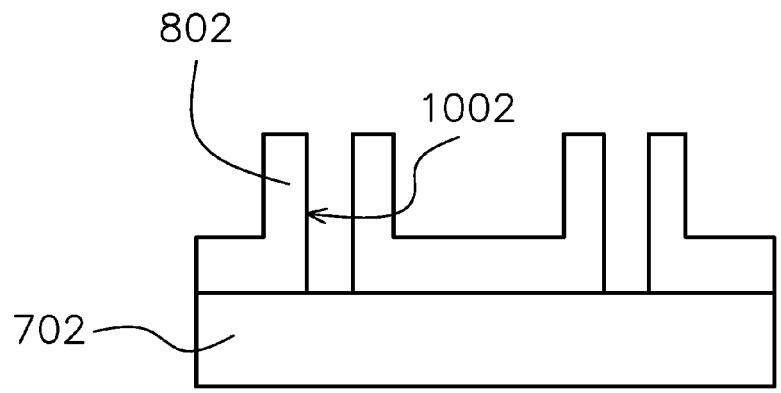
FIG. 10A is a sectional view of an exemplary semiconductor structure at one stage during fabrication of bare-shaped nanowires for vertical gate all around transistors in accordance with some embodiments.
Figure 10B:
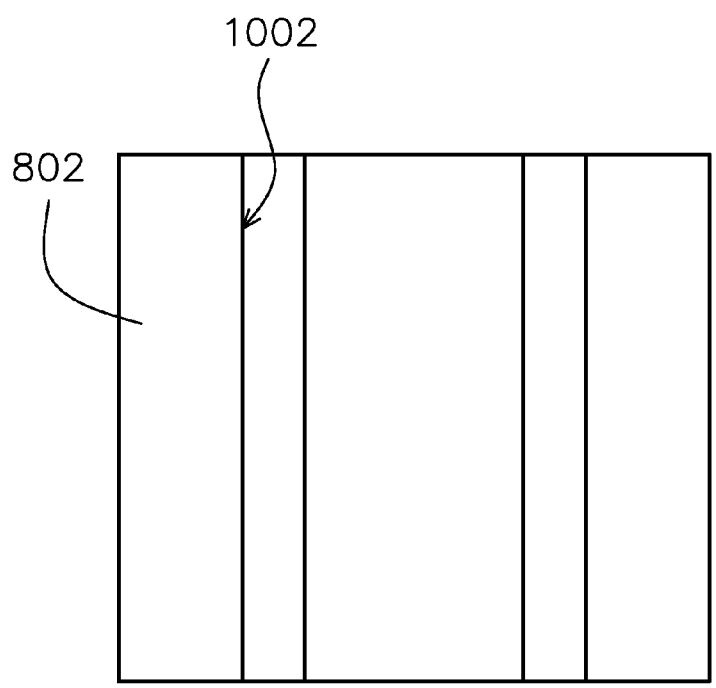
FIG. 10B is a top view of an exemplary semiconductor structure at one stage during fabrication of bare-shaped nanowires for vertical gate all around transistors in accordance with some embodiments.

FIG. 10A is a sectional view of an exemplary semiconductor structure at one stage during fabrication of bare-shaped nanowires for vertical gate all around transistors in accordance with some embodiments. FIG. 10B is a top view of an exemplary semiconductor structure at one stage during fabrication of bare-shaped nanowires for vertical gate all around transistors in accordance with some embodiments. As shown in FIGS. 10A and 10B, the sacrificial protrusion 704 is removed to expose an inner surface 1002 (e.g., inner sidewalls) of the nanowire material 802. In case that the nanowire material 802 is SiGe and the sacrificial protrusion 704 is made of silicon, the removal of the sacrificial protrusion 704 may be realized by using $NH_4OH$, so as to selectively remove the sacrificial protrusion 704 while keeping the nanowire material 802.

Figure 11A:
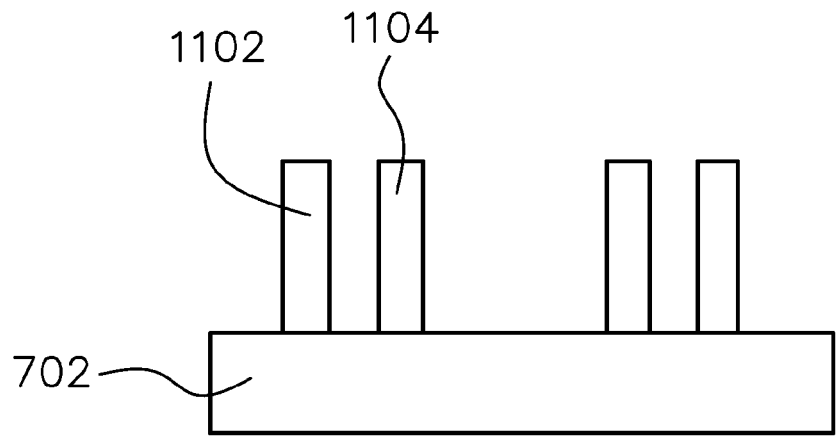
FIG. 11A is a sectional view of an exemplary semiconductor structure at one stage during fabrication of bare-shaped nanowires for vertical gate all around transistors in accordance with some embodiments.
Figure 11B:
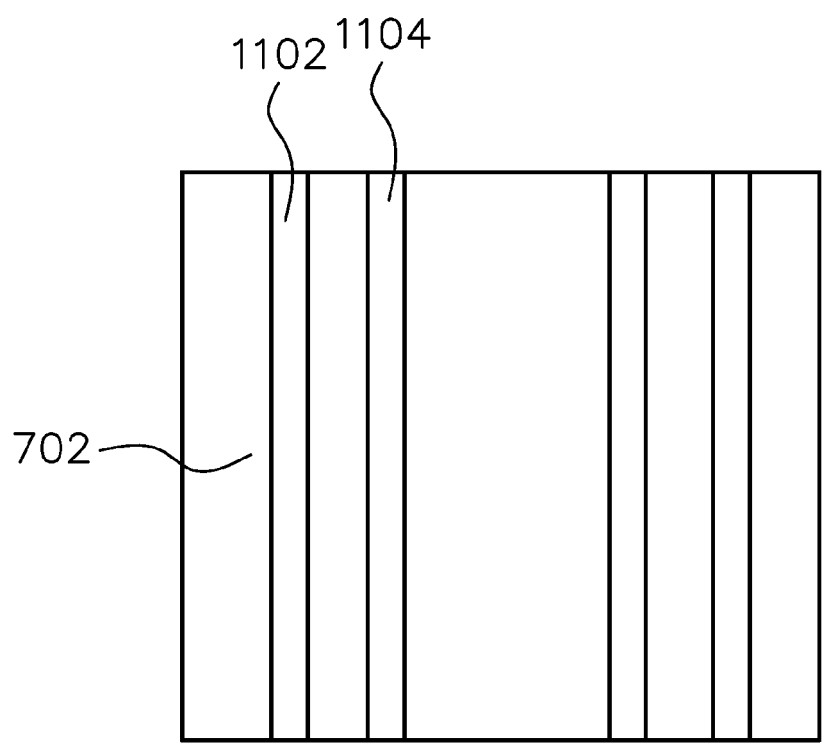
FIG. 11B is a top view of an exemplary semiconductor structure at one stage during fabrication of bare-shaped nanowires for vertical gate all around transistors in accordance with some embodiments.

FIG. 11A is a sectional view of an exemplary semiconductor structure at one stage during fabrication of bare-shaped nanowires for vertical gate all around transistors in accordance with some embodiments. FIG. 11B is a top view of an exemplary semiconductor structure at one stage during fabrication of bare-shaped nanowires for vertical gate all around transistors in accordance with some embodiments. As shown in FIGS. 11A and 11B, except for those to be formed as bare-shaped nanowires 1102 and 1104, the nanowire material 802 are removed, by using dry etching, for example, ICP (inductively coupled plasma), TCP (transformer coupled plasma), ECR (electron cyclotron resonance), or RIE (reactive ion etch) with F-based or Cl-based gaseous reactants, so as to provide two bare-shaped symmetric nanowires 1102, 1104 made of the nanowire material for a vertical gate all around transistor (e.g., operation 108 of FIG. 1). In the embodiment, each of the symmetric bare-shaped nanowires 1102, 1104 has the same dimension.

In some embodiments, shrinkage of the sacrificial protrusion 704 may be applied before the provision of the nanowire material 802 symmetric with respect to the sacrificial protrusion 204 (e.g., operation 106 of FIG. 1). In some embodiments, shrinkage of the bare-shaped nanowire 1102 may be applied after the formation thereof.

Furthermore, a plurality of processes may be performed on the semiconductor structure, such as, for example, providing a gate oxide adjacent to the bare-shaped nanowires 1102 and 1104; and providing a gate metal adjacent to the gate oxide.

Figure 12:
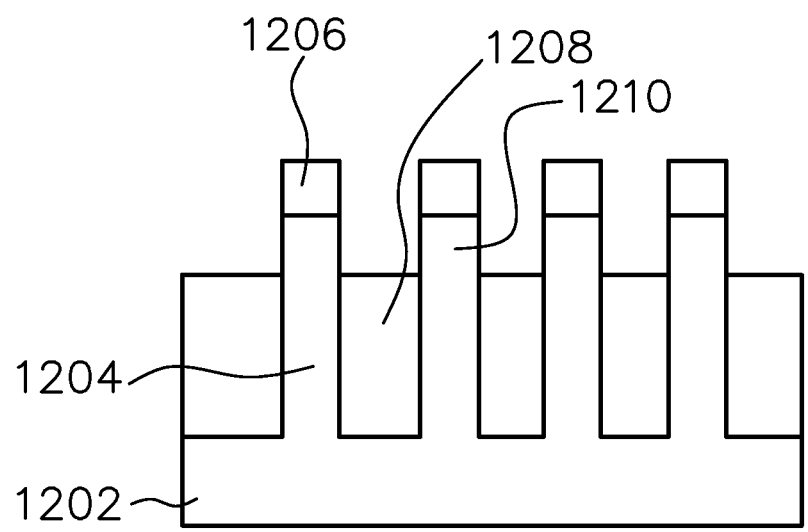
FIGS. 12-16 are sectional views of an exemplary semiconductor structure at one stage during fabrication of nanowires for horizontal gate all around transistors in accordance with some embodiments.

FIG. 12 is a sectional view of an exemplary semiconductor structure at one stage during fabrication of nanowires for horizontal gate all around transistors in accordance with some embodiments. As shown in FIG. 12, a substrate 1202 is provided (e.g., operation 102 of FIG. 1). The material of the substrate 1202 may include, for example, Si, SiGe, Ge, or III-V (InP, GaAs, AlAs, InAs, InAlAs, InGaAs, InSb, GaSb, InGaSb).

A sacrificial protrusion 1204 is provided over the substrate 1202 (e.g., operation 104 of FIG. 1). The material of the sacrificial protrusion 1204 may include, for example, Si, SiGe, Ge, or III-V (InP, GaAs, AlAs, InAs, InAlAs, InGaAs, InSb, GaSb, InGaSb). In some embodiments, a hard mask 1206 made of SiCN is provided over the top of the sacrificial protrusion 1204. In some embodiments, shallow trench isolations 1208 are formed between the sacrificial protrusion 1204 and another sacrificial protrusion 1210.

Figure 13:
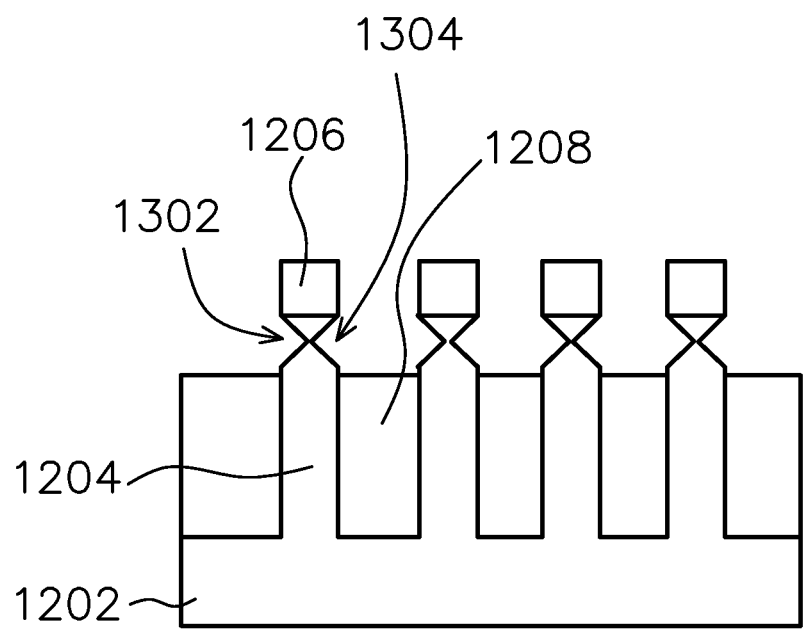

FIG. 13 is a sectional view of an exemplary semiconductor structure at one stage during fabrication of nanowires for horizontal gate all around transistors in accordance with some embodiments. As shown in FIG. 13, the sacrificial protrusion 1204 is selectively partial removed to produce two recesses 1302, 1304. In case that the sacrificial protrusion 1204 is made of silicon, the removal of the sacrificial protrusion 1204 may be realized by using $NH_4OH$.

Figure 14:
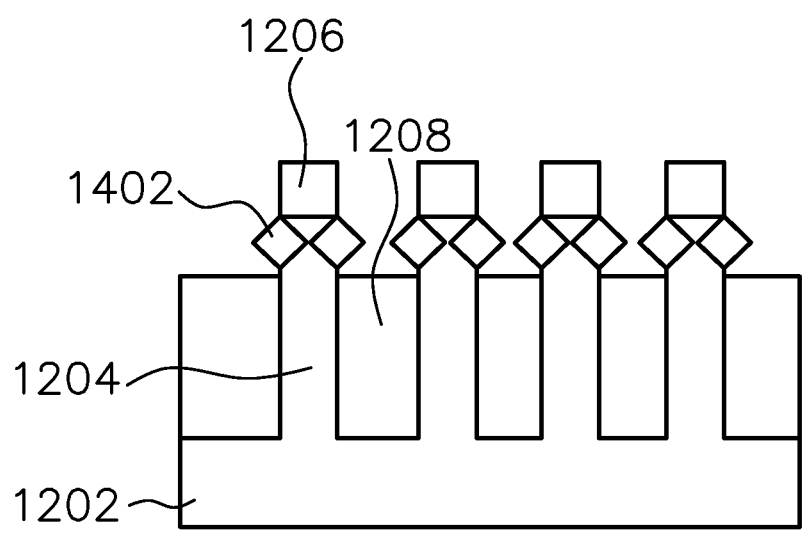

FIG. 14 is a sectional view of an exemplary semiconductor structure at one stage during fabrication of nanowires for horizontal gate all around transistors in accordance with some embodiments. As shown in FIG. 14, a nanowire material 1402 is provided symmetric with respect to the sacrificial protrusion 1204 (e.g., operation 106 of FIG. 1) and further in the recesses 1302, 1304. In some embodiments, the provision of nanowire material 1402 may be realized by conformal epitaxial growth. An exemplary condition for the epitaxial growth includes: a pressure of 10-20 torr, a temperature of 570-600° C., and reactants of $GeH_4$ of 100-600 sccm, $SiCl_2H_2$ of 100-600 sccm, and HCl of 50-200 sccm. In some embodiments, the nanowire material 1402 is SiGe and the sacrificial protrusion 1204 is made of silicon.

Figure 15:
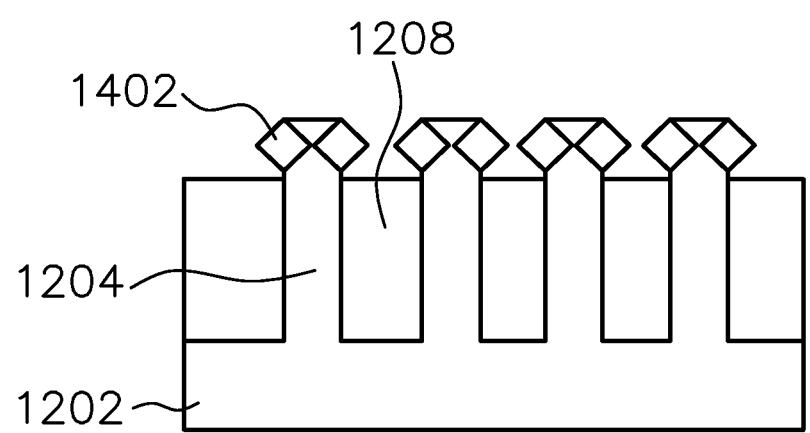

FIG. 15 is a sectional view of an exemplary semiconductor structure at one stage during fabrication of nanowires for horizontal gate all around transistors in accordance with some embodiments. As shown in FIG. 15, the hard mask 1206 is removed to expose the sacrificial protrusion 1204 by using dilute HF or by using dry etching, for example, ICP (inductively coupled plasma), TCP (transformer coupled plasma), ECR (electron cyclotron resonance), or RIE (reactive ion etch) with F-based or Cl-based gaseous reactants.

Figure 16:
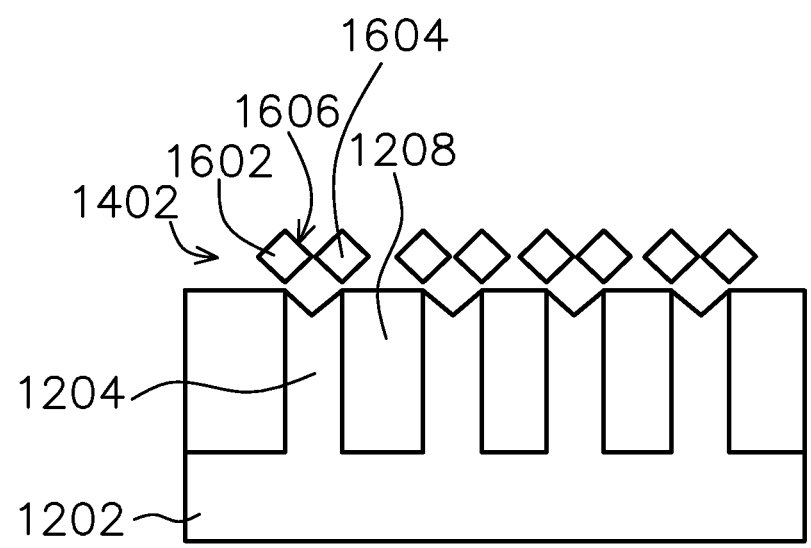

FIG. 16 is a sectional view of an exemplary semiconductor structure at one stage during fabrication of nanowires for horizontal gate all around transistors in accordance with some embodiments. As shown in FIG. 16, the sacrificial protrusion 1204 is removed to expose an inner surface 1606 of the nanowire material 1402 and produce two symmetric nanowires 1602 and 1604 (e.g., operation 108 of FIG. 1), by using $NH_4OH$, so as to selectively remove the sacrificial protrusion 1204 while keeping the nanowire material 1402. In the embodiment, each of the symmetric nanowires 1602, 1604 has the same dimension.

Figure 17:
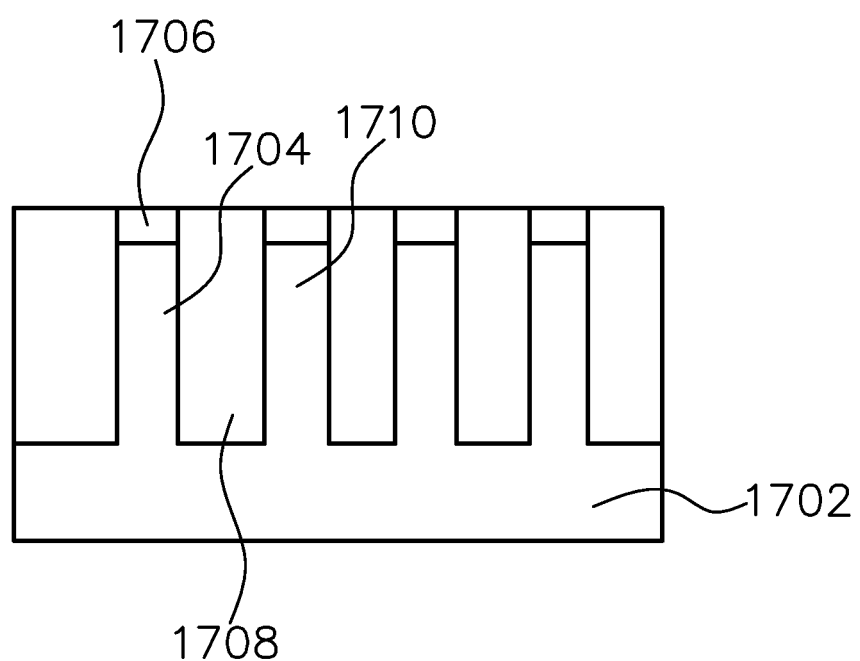
FIGS. 17-20 are sectional views of an exemplary semiconductor structure at one stage during fabrication of nanowires for horizontal gate all around transistors in accordance with some embodiments.

FIG. 17 is a sectional view of an exemplary semiconductor structure at one stage during fabrication of nanowires for horizontal gate all around transistors in accordance with some embodiments. As shown in FIG. 17, a substrate 1702 is provided (e.g., operation 102 of FIG. 1). The material of the substrate 1702 may include, for example, Si, SiGe, Ge, or III-V (InP, GaAs, AlAs, InAs, InAlAs, InGaAs, InSb, GaSb, InGaSb).

A sacrificial protrusion 1704 is provided over the substrate 1702 (e.g., operation 104 of FIG. 1). The material of the sacrificial protrusion 1704 may include, for example, Si, SiGe, Ge, or III-V (InP, GaAs, AlAs, InAs, InAlAs, InGaAs, InSb, GaSb, InGaSb). A nanowire material 1706 is provided symmetric with respect to the sacrificial protrusion 1704 (e.g., operation 106 of FIG. 1) and further over the top of the sacrificial protrusion 1704. In some embodiments, the provision of nanowire material 1706 may be realized by epitaxial growth. An exemplary condition for the epitaxial growth includes: a pressure of 10-20 torr, a temperature of 570-600° C., and reactants of $GeH_4$ of 100-600 sccm, $SiCl_2H_2$ of 100-600 sccm, and HCl of 50-200 sccm. In some embodiments, the nanowire material 1706 is SiGe and the sacrificial protrusion 1704 is made of silicon. In some embodiments, shallow trench isolations 1708 are formed between the sacrificial protrusion 1704 and another sacrificial protrusion 1710.

Figure 18:
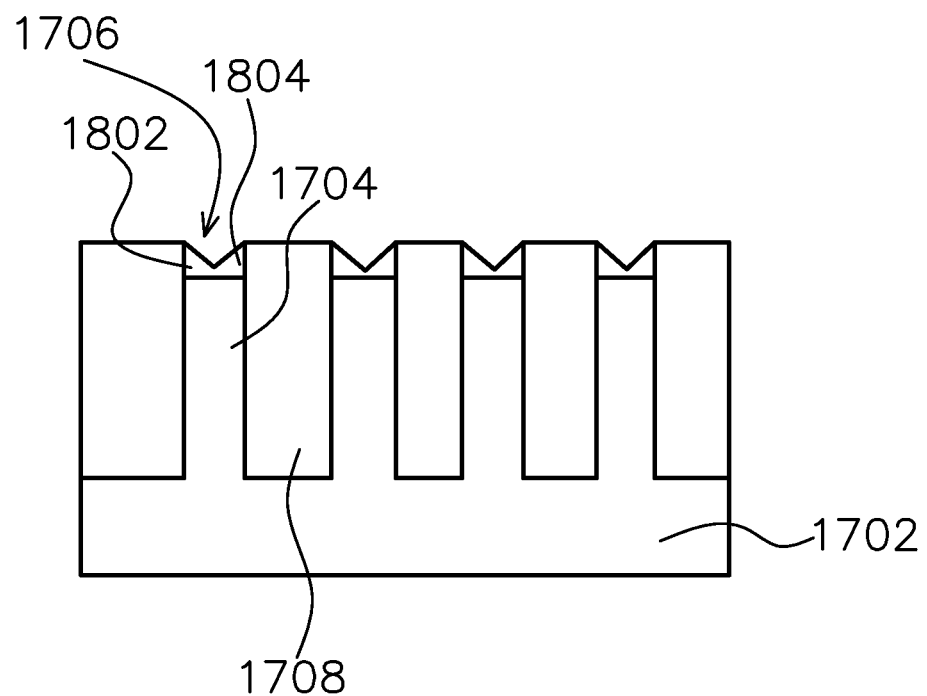

FIG. 18 is a sectional view of an exemplary semiconductor structure at one stage during fabrication of nanowires for horizontal gate all around transistors in accordance with some embodiments. As shown in FIG. 18, the nanowire material 1706 is etched at its central region to produce two separated nanowires 1802 and 1804 and to expose the top surface of the sacrificial protrusion 1704, by using wet etching, for example, with TMAH or KOH.

Figure 19:
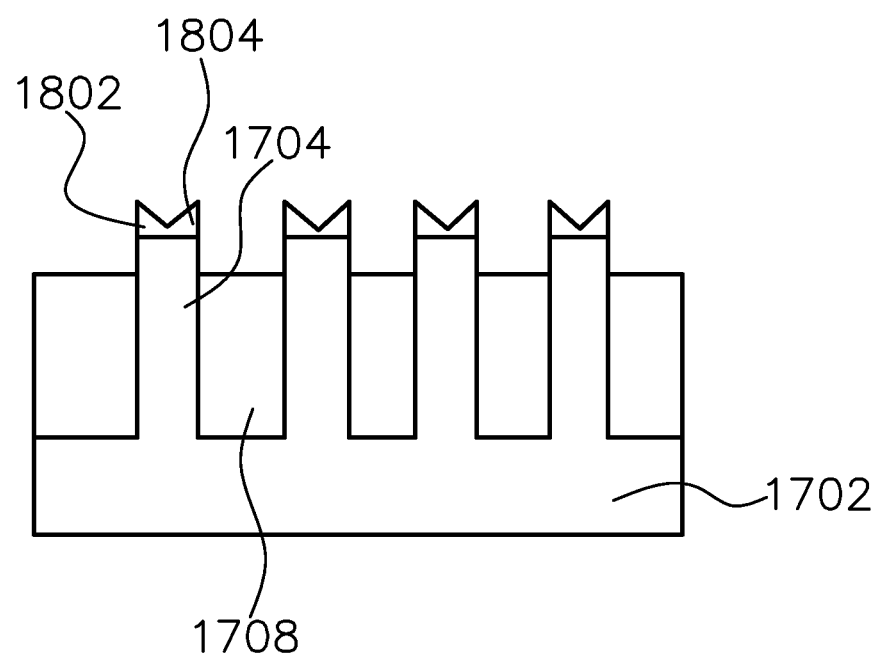

FIG. 19 is a sectional view of an exemplary semiconductor structure at one stage during fabrication of nanowires for horizontal gate all around transistors in accordance with some embodiments. As shown in FIG. 19, the STI 1708 is etched to expose sidewalls of the sacrificial protrusion 1704.

Figure 20:
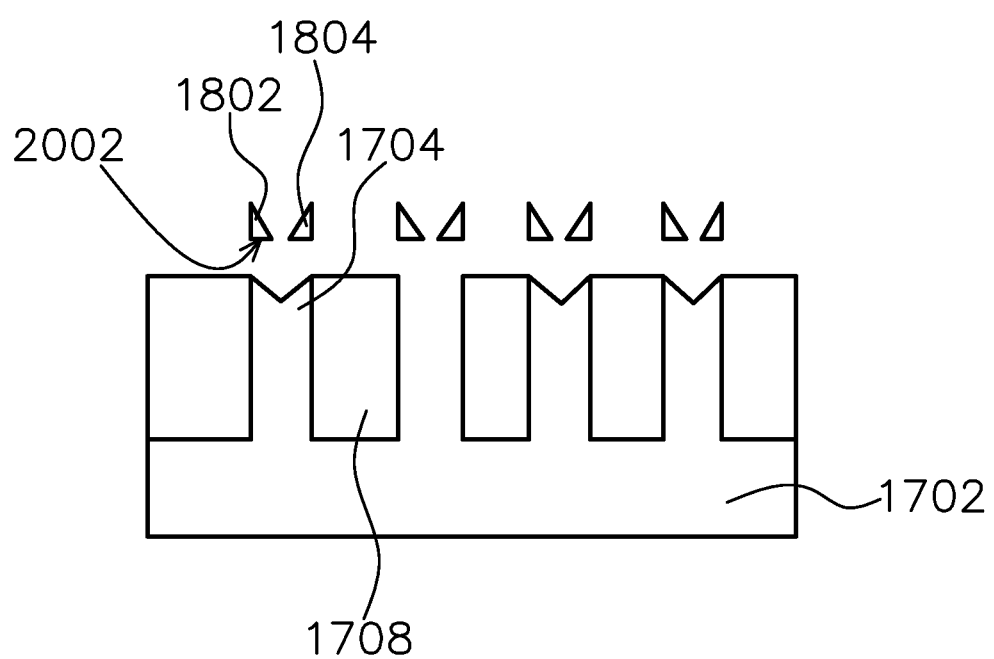

FIG. 20 is a sectional view of an exemplary semiconductor structure at one stage during fabrication of nanowires for horizontal gate all around transistors in accordance with some embodiments. As shown in FIG. 20, the sacrificial protrusion 1704 is removed to produce two symmetric nanowires 1802 and 1804 (e.g., operation 108 of FIG. 1) by $NH_4OH$, and to expose an inner surface 2002 (e.g., bottom surface) of the nanowires 1802. In the embodiment, each of the symmetric nanowires 1802, 1804 has the same dimension.

Figure 21:
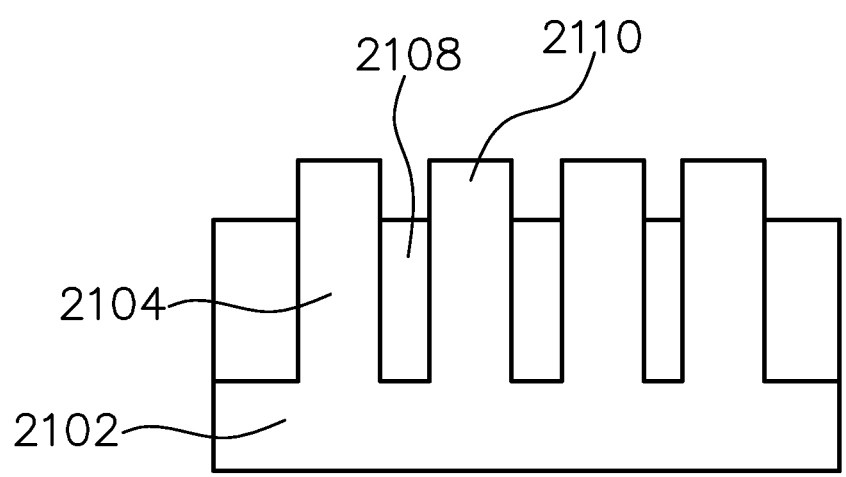
FIGS. 21-25 are sectional views of an exemplary semiconductor structure at one stage during fabrication of nanowires for horizontal gate all around transistors in accordance with some embodiments.

FIG. 21 is a sectional view of an exemplary semiconductor structure at one stage during fabrication of nanowires for horizontal gate all around transistors in accordance with some embodiments. As shown in FIG. 21, a substrate 2102 is provided (e.g., operation 102 of FIG. 1). The material of the substrate 2102 may include, for example, Si, SiGe, Ge, or III-V (InP, GaAs, AlAs, InAs, InAlAs, InGaAs, InSb, GaSb, InGaSb).

A sacrificial protrusion 2104 is provided over the substrate 2102 (e.g., operation 104 of FIG. 1). The material of the sacrificial protrusion 2104 may include, for example, Si, SiGe, Ge, or III-V (InP, GaAs, AlAs, InAs, InAlAs, InGaAs, InSb, GaSb, InGaSb). In some embodiments, shallow trench isolations 2108 are formed between the sacrificial protrusion 2104 and another sacrificial protrusion 2110.

Figure 22:
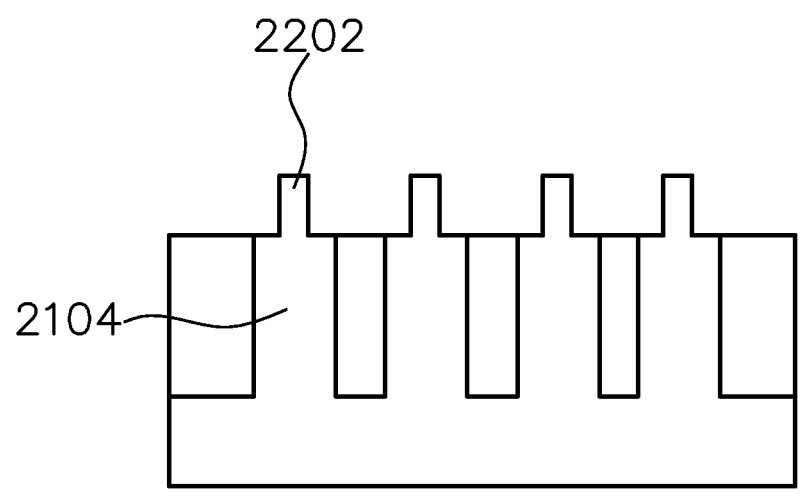

FIG. 22 is a sectional view of an exemplary semiconductor structure at one stage during fabrication of nanowires for horizontal gate all around transistors in accordance with some embodiments. As shown in FIG. 22, the sacrificial protrusion 2104 is selectively partial removed to produce a smaller protrusion 2202.

Figure 23:
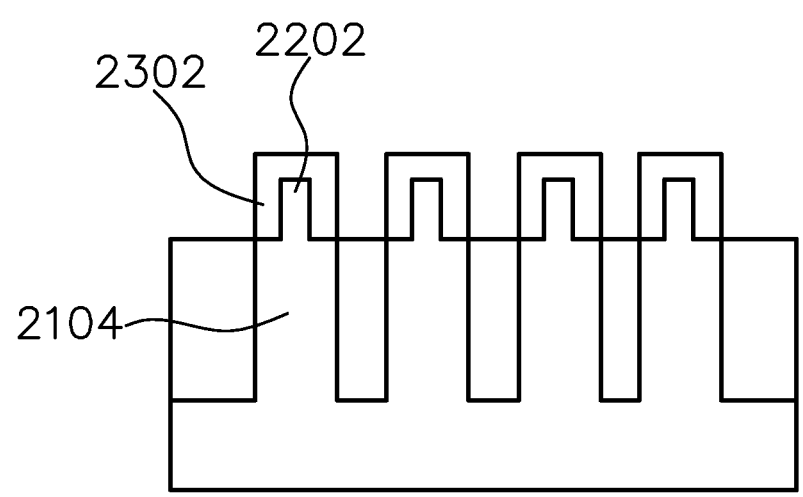

FIG. 23 is a sectional view of an exemplary semiconductor structure at one stage during fabrication of nanowires for horizontal gate all around transistors in accordance with some embodiments. As shown in FIG. 23, a U-shape nanowire material 2302 is provided symmetric with respect to the sacrificial protrusion 2104 (e.g., operation 106 of FIG. 1) and further surrounds the smaller protrusion 2202. In some embodiments, the provision of nanowire material 2302 may be realized by conformal epitaxial growth. An exemplary condition for the epitaxial growth includes: a pressure of 10-20 torr, a temperature of 570-600° C., and reactants of $GeH_4$ of 100-600 sccm, $SiCl_2H_2$ of 100-600 sccm, and HCl of 50-200 sccm. In some embodiments, the nanowire material 2302 is SiGe and the sacrificial protrusion 2104 is made of silicon.

Figure 24:
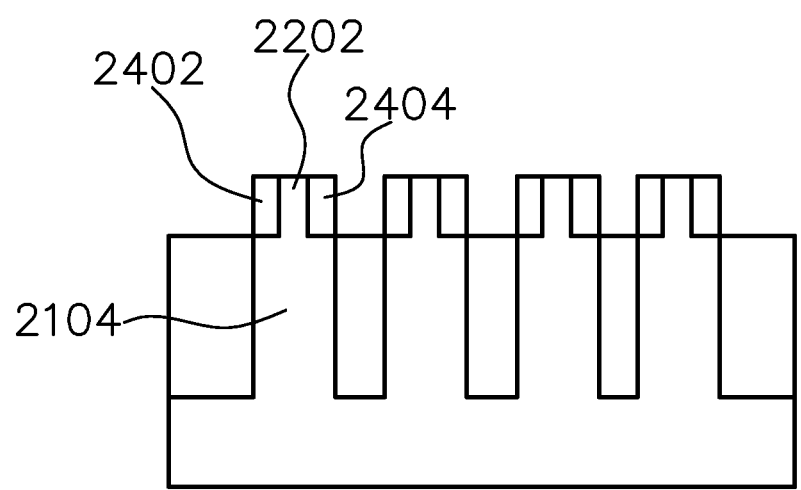

FIG. 24 is a sectional view of an exemplary semiconductor structure at one stage during fabrication of nanowires for horizontal gate all around transistors in accordance with some embodiments. A portion of the nanowire material 2302 is removed to expose the smaller protrusion 2202 by using CMP process or dry etching and to produce two separated nanowires 2402 and 2404.

Figure 25:
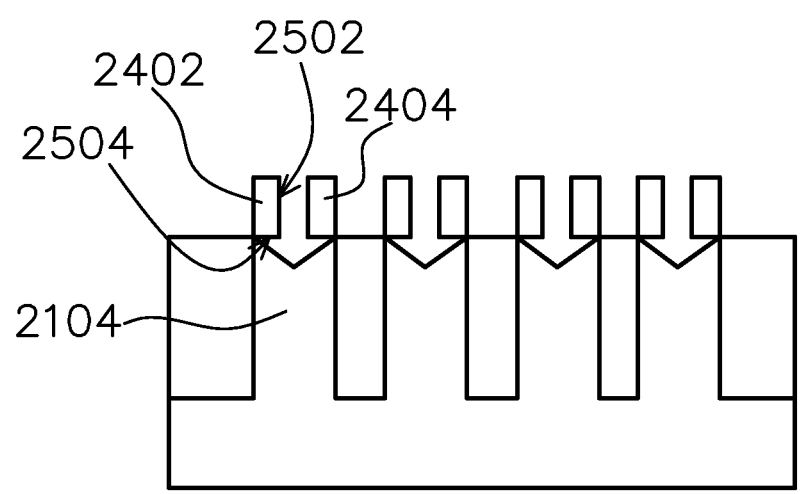

FIG. 25 is a sectional view of an exemplary semiconductor structure at one stage during fabrication of nanowires for horizontal gate all around transistors in accordance with some embodiments. As shown in FIG. 25, a portion of the sacrificial protrusion 2104 including the smaller protrusion 2202 is removed to produce two symmetric nanowires 2402 and 2404 (e.g., operation 108 of FIG. 1) and to expose an inner surface 2502 and a bottom surface 2504 of the nanowire material 2402, by using $NH_4OH$ so as to selectively remove the sacrificial protrusion 2104 while keeping the nanowires 2402 and 2404. In the embodiment, each of the symmetric nanowires 2402, 2404 has the same dimension.

Figure 26:
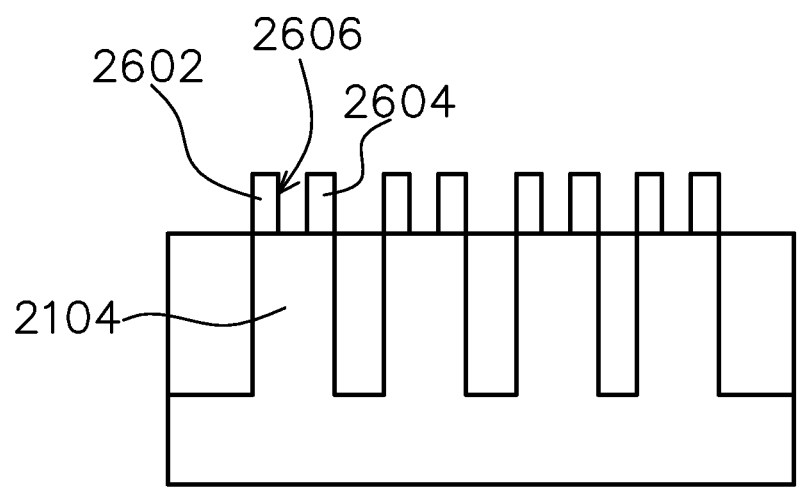
FIG. 26 is a sectional view of an exemplary semiconductor structure at one stage during fabrication of fins in accordance with some embodiments.

FIG. 26 is a sectional view of an exemplary semiconductor structure at one stage during fabrication of fins in accordance with some embodiments. Steps for forming fins are similar to FIGS. 21-24, which are not repeated herein. As shown in FIG. 26, continuing from FIG. 24, the smaller protrusion 2202 is removed to produce two symmetric nanowires 2602 and 2604 (e.g., operation 108 of FIG. 1) and to expose an inner surface 2606 of the material 2302, by using $NH_4OH$, so as to selectively remove the sacrificial protrusion 2104 while keeping the fins 2602 and 2604. In the embodiment, each of the symmetric nanowires 2602, 2604 has the same dimension.

Figure 27:
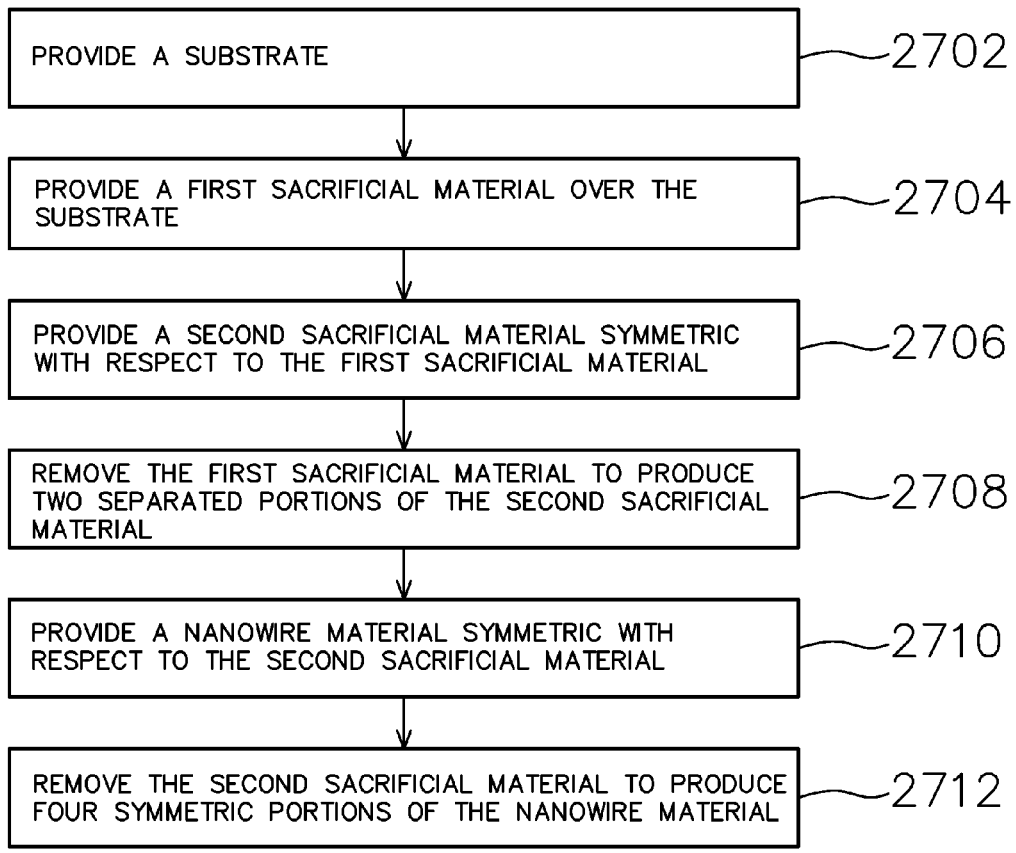
FIG. 27 is another flow chart of a method of forming nanowires in accordance with some embodiments.

FIG. 27 is a flow chart of a method of forming nanowires in accordance with some embodiments. As shown in FIG. 27, the method 2700 begins with the provision of a substrate (operation 2702). A first sacrificial material is then provided over the substrate (operation 2704). A second sacrificial material is provided symmetric with respect to the first sacrificial material (operation 2706). The first sacrificial material is removed to produce two separated portions of the second sacrificial material (operation 2708). A nanowire material is provided symmetric with respect to the second sacrificial material (operation 2710). The second sacrificial material is removed to produce four symmetric portions of the nanowire material (operation 2712).

Figure 28:
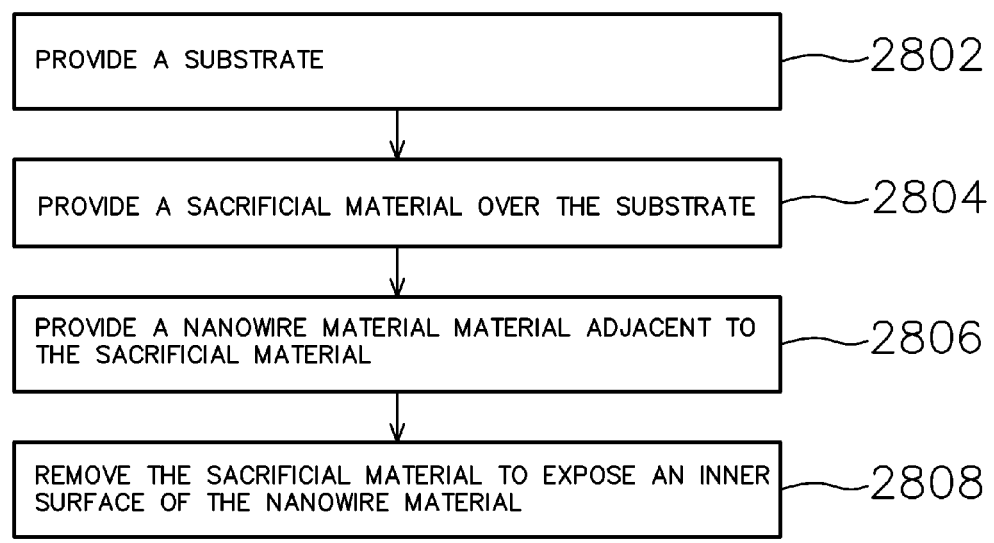
FIG. 28 is a flow chart of a method of forming nanowires in accordance with some embodiments.

FIG. 28 is a flow chart of a method of forming nanowires in accordance with some embodiments. As shown in FIG. 28, the method 2800 begins with the provision of a substrate, for example, substrate 202 (operation 2802). A sacrificial material, for example, sacrificial material 204, is then provided over the substrate (operation 2804). A nanowire material, for example, material 302, is provided adjacent to the sacrificial material (operation 2806). The sacrificial material is removed to expose an inner surface of the nanowire material (operation 2808).

In some embodiments, the operation of providing the nanowire material adjacent to the sacrificial material further comprises providing the nanowire material adjacent to the sacrificial material by using epitaxial growth. In some embodiments, the operation of providing the sacrificial material over the substrate further comprises providing the sacrificial material made of silicon, and wherein providing the nanowire material adjacent to the sacrificial material further comprises providing the nanowire material made of SiGe compound material.

In some embodiments, the operation of removing the sacrificial material expose an inner surface of the nanowire material further comprises selectively etching the sacrificial material by using ammonium hydroxide ($NH_4OH$) without removing the nanowire material. The method 2800 further comprises forming a hard mask over a top of the nanowire material. In some embodiments, the operation of providing the nanowire material adjacent to the sacrificial material further comprises providing the nanowire material adjacent to the sacrificial material except for those covered by the hard mask.

The method 2800 further comprises removing the hard mask to expose the sacrificial material. The method 2800 further comprises shrinking the nanowire material by isotropic etching. In some embodiments, the operation of providing the sacrificial material over the substrate further comprises providing the sacrificial material by using the same material as the substrate. The method 2800 further comprises etching the sacrificial material to provide at least two recesses before providing the nanowire material adjacent to the sacrificial material. In some embodiments, the operation of providing the nanowire material adjacent to the sacrificial material further comprises providing at least two separated portions of the nanowire material adjacent to the sacrificial material in the recesses respectively.

In some embodiments, the operation of providing the nanowire material adjacent to the sacrificial material further comprises etching the nanowire material at its central region to providing at least two separated portions of the nanowire material. The method 2800 further comprises etching the sacrificial material to provide a protrusion before providing the nanowire material adjacent to the sacrificial material.

In some embodiments, the operation of removing the sacrificial material to expose an inner surface of the nanowire material further comprises removing the sacrificial material to expose an inner sidewall of the nanowire material. In some embodiments, the operation of removing the sacrificial material to expose an inner surface of the nanowire material further comprises removing the sacrificial material to expose a bottom surface of the nanowire material. The method 2800 further comprises providing a gate oxide adjacent to the nanowire material; and providing a gate metal adjacent to the gate oxide.

In some embodiments, the sacrificial protrusion is made of silicon, and the nanowire is made of SiGe. In some embodiments, the nanowire is conformal epitaxy. The nanowire material or fin material is not limited, might be Si, SiGe, Ge, or III-V material (InP, GaAs, AlAs, InAs, InAlAs, InGaAs, InSb, GaSb, InGaSb).

Returning to FIG. 1, the operation of providing the nanowire material symmetric with respect to the sacrificial material further comprises providing the nanowire material symmetric with respect to the sacrificial material by using epitaxial growth. The operation of providing the sacrificial material over the substrate further comprises providing the sacrificial material made of silicon, and wherein providing the nanowire material symmetric with respect to the sacrificial material further comprises providing the nanowire material made of SiGe compound material.

The method 100 further includes forming a hard mask over a top of the nanowire material. The operation of providing the nanowire material symmetric with respect to the sacrificial material further comprises providing the nanowire material symmetric with respect to the sacrificial material except for those covered by the hard mask. The method 100 further includes removing the hard mask to expose the sacrificial material.

The method 100 further includes etching the sacrificial material to provide at least two recesses before providing the nanowire material symmetric with respect to the sacrificial material. The operation of providing the nanowire material symmetric with respect to the sacrificial material further comprises providing at least two separated portions of the nanowire material symmetric with respect to the sacrificial material in the recesses respectively.

The operation of providing the nanowire material symmetric with respect to the sacrificial material further comprises etching the nanowire material at its central region to providing at least two separated portions of the nanowire material. The method 100 further includes etching the sacrificial material to provide a protrusion before providing the nanowire material symmetric with respect to the sacrificial material.

According to an embodiment, a semiconductor structure is provided. The structure includes: a substrate; a sacrificial protrusion over the substrate; a hard mask over a top of the sacrificial protrusion; and a nanowire surrounding the sacrificial protrusion.

According to another embodiment, a method of forming nanowires is provided. The method includes the following operations: providing a substrate; providing a sacrificial material over the substrate; providing a nanowire material adjacent to the sacrificial material; and removing the sacrificial material to expose an inner surface of the nanowire material.

According to another embodiment, a method of forming nanowires is provided. The method includes the following operations: providing a substrate; providing a first sacrificial material over the substrate; providing a second sacrificial material adjacent to the first sacrificial material; removing the first sacrificial material to produce two separated portion of the second sacrificial material; providing a nanowire material adjacent to the second sacrificial material; and removing the second sacrificial material to produce four separated portion of the second sacrificial material. According to another embodiment, a method of forming nanowires is provided. The method includes the following operations: providing a substrate; providing a sacrificial material made of silicon over the substrate; providing a nanowire material made of SiGe adjacent to the sacrificial material by using conformal epitaxial growth; and removing the sacrificial material to expose an inner surface of the nanowire material by using ammonium hydroxide without removing the nanowire material.

According to another embodiment, a semiconductor structure is provided. The structure includes: a substrate; a first nanowire over the substrate; and a second nanowire over the substrate and substantially symmetric with the first nanowire.

According to another embodiment, a semiconductor structure is provided. The structure includes: a substrate; an annular nanowire over the substrate and substantially symmetric with respect to a center thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming nanowires, comprising:
   providing a substrate;
   providing a sacrificial material over the substrate;
   etching the sacrificial material to form a protrusion that comprises the sacrificial material;
   performing an epitaxial growth process to form a nanowire material symmetric with respect to the protrusion, the nanowire material including L-shaped portions that coat (i) sidewalls of the protrusion, and (ii) portions of the substrate;
   removing the sacrificial material; and
   removing portions of the nanowire material coating the substrate to provide two symmetric nanowires made of the nanowire material.

2. The method of claim 1, wherein the sacrificial material comprises silicon, and the nanowire material comprises silicon germanium (SiGe).

3. The method of claim 1, further comprising forming a hard mask over a top of the sacrificial material.

4. The method of claim 3, wherein the nanowire material is not formed over portions of the sacrificial material covered by the hard mask.

5. The method of claim 3, further comprising removing the hard mask to expose the sacrificial material.

6. A method of forming nanowires, comprising:
   providing a substrate;
   providing a sacrificial material over the substrate;
   forming a mask over a top of the sacrificial material;
   etching the sacrificial material using the mask as a masking layer to form a protrusion that comprises the sacrificial material;
   providing a nanowire material symmetric with respect to the protrusion that coats sidewalls of the protrusion, wherein the mask has a width that is equal to that of the protrusion, the mask covering a top portion of the protrusion and leaving exposed the nanowire material coating the sidewalls of the protrusion; and
   removing the sacrificial material to provide two symmetric nanowires made of the nanowire material.

7. The method of claim 6, wherein the providing of the nanowire material comprises performing an epitaxial growth process.

8. The method of claim 6, wherein the sacrificial material comprises silicon, and the nanowire material comprises silicon germanium (SiGe).

9. The method of claim 6, wherein the nanowire material is not formed over portions of the sacrificial material covered by the mask.

10. The method of claim 6, further comprising removing the mask to expose the sacrificial material.

11. A method of forming nanowires, comprising:
    providing a substrate;
    forming a protrusion comprising a sacrificial material on the substrate;
    performing an epitaxial growth process to form a nanowire material symmetric with respect to the protrusion, the nanowire material including L-shaped portions that coat sidewalls of the protrusion and portions of the substrate; and
    removing (i) the sacrificial material, and (ii) portions of the nanowire material coating the substrate to provide two symmetric nanowires made of the nanowire material, wherein the removal of the sacrificial material exposes inner sidewalls of the nanowires.

12. The method of claim 11, wherein the sacrificial material comprises silicon, and the nanowire material comprises silicon germanium (SiGe).

13. The method of claim 11, further comprising forming a hard mask over a top of the sacrificial material.

14. The method of claim 13, wherein the nanowire material is not formed over portions of the sacrificial material covered by the hard mask.

15. The method of claim 13, further comprising removing the hard mask to expose the sacrificial material.

\* \* \* \* \*